(12) United States Patent
Wang et al.

(10) Patent No.: US 11,722,131 B2
(45) Date of Patent: Aug. 8, 2023

(54) ADAPTIVE ANTI-AGING SENSOR BASED ON CUCKOO ALGORITHM

(71) Applicant: Wenzhou University, Zhejiang (CN)

(72) Inventors: Pengjun Wang, Zhejiang (CN); Hai Ming Zhang, Zhejiang (CN); Yue Jun Zhang, Zhejiang (CN); Gang Li, Zhejiang (CN); Bo Chen, Zhejiang (CN)

(73) Assignee: Wenzhou University, Zhejiang (CN)

( * ) Notice: Subject to any disclaimer, the term of this patent is extended or adjusted under 35 U.S.C. 154(b) by 0 days.

(21) Appl. No.: 17/801,799

(22) PCT Filed: Nov. 23, 2020

(86) PCT No.: PCT/CN2020/130804
§ 371 (c)(1),
(2) Date: Aug. 24, 2022

(87) PCT Pub. No.: WO2022/082919
PCT Pub. Date: Apr. 28, 2022

(65) Prior Publication Data
US 2023/0085939 A1    Mar. 23, 2023

(30) Foreign Application Priority Data
Oct. 19, 2020  (CN) .......................... 202011115997.7

(51) Int. Cl.
*H03K 17/00*     (2006.01)
*H03K 17/14*     (2006.01)
(Continued)

(52) U.S. Cl.
CPC ............. *H03K 17/145* (2013.01); *G06F 1/04* (2013.01); *H03K 3/037* (2013.01); *H03K 21/12* (2013.01)

(58) Field of Classification Search
CPC ...... H03K 17/145; H03K 3/037; H03K 21/12; G01R 31/31703; G01R 31/31705;
(Continued)

(56) References Cited

U.S. PATENT DOCUMENTS

2019/0156600 A1    5/2019  Potyrailo et al.
2020/0142000 A1*   5/2020  Wang ................. G01R 31/2884
(Continued)

FOREIGN PATENT DOCUMENTS

| CN | 106970317 | 7/2017 |
| CN | 207232189 | 4/2018 |
| CN | 110672943 | 1/2020 |

OTHER PUBLICATIONS

Yi Maoxiang et al., "Critical gate identification algorithm for anti-aging gate replacement technology", Journal of Southeast University (Natural Science Edition), May 2018, submit with English abstract, pp. 411-416.

*Primary Examiner* — Tuan T Lam
(74) *Attorney, Agent, or Firm* — JCIP Global Inc.

(57) ABSTRACT

An adaptive anti-aging sensor based on a cuckoo algorithm, comprising a control module, a reference voltage-controlled oscillator, two shaping circuits, a frequency difference circuit, a resolution adjustment circuit, a 16-bit counter, a parallel-to-serial circuit, an adaptive module, and a digital-to-analog converter. A lookup table is prestored in the adaptive module; when aging monitoring is performed on a voltage-controlled oscillator in an integrated circuit, the adaptive module uses the cuckoo algorithm to determines the optimal working voltage of the currently monitored voltage-controlled oscillator, and the control module accordingly changes the input voltage of the voltage-controlled oscillator of the integrated circuit. The present invention has the advantages that the degree of aging of the integrated circuit is reflected by monitoring the degree of aging of the (Continued)

voltage-controlled oscillator in the integrated circuit, and the optimal working voltage of the voltage-controlled oscillator in the integrated circuit is adaptively adjusted.

5 Claims, 3 Drawing Sheets

(51) Int. Cl.
*G06F 1/04* (2006.01)
*H03K 3/037* (2006.01)
*H03K 21/12* (2006.01)

(58) Field of Classification Search
CPC ........ G01R 31/31708; G01R 31/31816; G01R 31/3183; G01R 31/318371
See application file for complete search history.

(56) References Cited

U.S. PATENT DOCUMENTS

| | | | | |
|---|---|---|---|---|
| 2021/0096172 A1* | 4/2021 | Wang | ................... | G01R 31/2879 |
| 2023/0083724 A1* | 3/2023 | Cella | ................... | G05B 19/4099 |
| | | | | 705/28 |

* cited by examiner

ADAPTIVE ANTI-AGING SENSOR BASED ON CUCKOO ALGORITHM

CROSS-REFERENCE TO RELATED APPLICATION

This application is a 371 of international application of PCT application serial no. PCT/CN2020/130804, filed on Nov. 23, 2020, which claims the priority benefit of China application no. 202011115997.7, filed on Oct. 19, 2020. The entirety of each of the above mentioned patent applications is hereby incorporated by reference herein and made a part of this specification.

TECHNICAL FIELD

The invention relates to an anti-aging sensor, in particular to an adaptive anti-aging sensor based on a cuckoo algorithm.

RELATED ART

With the development of the semiconductor technology, the integrated circuit (IC) process has entered the deep sub-micron phase and has remarkable advantages in performance and area. However, while the decrease of the size of and the increase of the integration level of circuits, the originally negligible parasitic effect of IC devices is becoming increasingly serious, which aggravates the aging of integrated circuits. The influence of aging on the reliability of the integrated circuits is becoming increasingly outstanding. Under the effect of aging, the threshold voltage of transistors in the integrated circuit will be increased, the flipping speed of logic gates will be slowed, and the delay will be increased, thus leading to a timing violation and resulting in a failure of the integrated circuits. When the process enters into the deep nano phase, the negative bias temperature instability (NBTI) has become the key factor causing the aging effect. The stable performance is the key indicator to the reliability of the IC devices, so the key technique urgently to be realized for the current nano technology is to maintain the good performance of the integrated circuits in the normal service life and delay the aging of the integrated circuits.

At present, national and international research institutions have made substantive studies on the anti-aging technology of integrated circuits and have fulfilled some achievements. Literature 1 "Critical Gate Identification Algorithm for Anti-aging Gate Replacement Technology" puts forward a critical gate identification algorithm and applies this algorithm to gate replacement technology in anti-aging schemes, signal duty cycle information and internal node information are obtained by logic emulation of netlists of circuits, and an anti-aging effect fulfilled by gate replacement is determined to identify critical gates to obtain a critical gate set meeting requirements, which is then replaced, so as to improve the anti-aging capacity of integrated circuits. However, this method replaces the critical gates at the initial design stage on the basis of meeting the timing margin, and different timing margins correspond to different critical gate sets, so that different degrees of aging correspond to different positions, numbers and types of critical gates, the repairing of integrated circuits under different degrees of aging is could not meet, and the applying range is limited.

As is known to all, the voltage-controlled oscillator, as a frequency generation unit, in the integrated circuit is always in a high-frequency working state, thus being more prone to aging than other circuit modules in the integrated circuit, which will lead to a performance degradation or even a failure of the whole integrated circuit. So, the degree of aging of the integrated circuit may be reflected by monitoring the degree of aging of the voltage-controlled oscillator, and the aging of the integrated circuit may be delayed by repairing an aging state of the voltage-controlled oscillator, so as to finally achieve the purpose of anti-aging of the integrated circuit.

SUMMARY OF INVENTION

The technical issue to be settled by the invention is to provide an adaptive anti-aging sensor based on a cuckoo algorithm, the adaptive anti-aging sensor can reflect the degree of aging of integrated circuits by monitoring the degree of aging of a voltage-controlled oscillator in the integrated circuits, and can adaptively adjust an optimal working voltage of the voltage-controlled oscillator in the integrated circuits according to the aging state of the voltage-controlled oscillator in the integrated circuits, can adaptively aging repair the voltage-controlled oscillator in the integrated circuits, can meet the repairing of integrated circuits under different degrees of aging, so as to finally achieve the purpose of anti-aging of the integrated circuits, and have a wide application range.

The technical solution adopted by the invention to settle the above technical issue is as follows: an adaptive anti-aging sensor based on a cuckoo algorithm comprises a control module, a reference voltage-controlled oscillator, two shaping circuits of the same structure, a frequency difference circuit, a resolution adjustment circuit, a 16-bit counter, a parallel-to-serial circuit, an adaptive module and a digital-to-analog converter; the control module has a feedback terminal, a first voltage output terminal, a second voltage output terminal and a control signal output terminal, the reference voltage-controlled oscillator and each of the shaping circuits have an input terminal and an output terminal respectively, the frequency difference circuit has a set terminal, a clock terminal and an output terminal, the resolution adjustment circuit has an input terminal, an output terminal and a control terminal, the 16-bit counter has a set terminal, a reset terminal and 16 bits of parallel output terminals, the adaptive module has a control terminal, 16 bits of parallel input terminals and 16 bits of parallel output terminals, the digital-to-analog converter has 16 bits of parallel input terminals and an output terminal, the parallel-to-serial module has a clock terminal, 16 bits of parallel input terminals and an output terminal, the two shaping circuits are referred to as a first shaping circuit and a second shaping circuit respectively, a voltage-controlled oscillator in an integrated circuit is referred to as a voltage-controlled oscillator under test, the reference voltage-controlled oscillator is completely identical with the voltage-controlled oscillator under test, the first voltage output terminal of the control module is used for connecting to an input terminal of the voltage-controlled oscillator under test, the second voltage output terminal of the control module is connected to the input terminal of the reference voltage-controlled oscillator, the control signal output terminal of the control module is connected to the control terminal of the resolution adjustment circuit and the control terminal of the adaptive module respectively, the input terminal of the first shaping circuit is used for connecting to an output terminal of the voltage-controlled oscillator under test, the output terminal of the reference voltage-controlled oscillator is connected to the input terminal of the second shaping circuit, the output terminal of the first shaping circuit is connected to the set terminal of the frequency difference circuit, the output terminal of the second shaping circuit is connected to the clock terminal of the frequency difference circuit respectively, the clock terminal of the parallel-to-serial module and the set terminal of the 16-bit counter, the output terminal of the frequency difference circuit is connected to the input terminal of the resolution adjustment circuit, the output terminal of the resolution adjustment circuit is connected to the reset terminal of the 16-bit counter, the 16 bits of parallel output terminals of the 16-bit counter are connected to the 16 bits of parallel input terminals of the parallel-to-serial module and the 16 bits of parallel input terminals of the adaptive module respectively, the 16 bits of parallel output terminals of the adaptive module are connected to the 16 bits of parallel input terminals of the digital-to-analog converter, and the output terminal of the digital-to-analog converter is connected to the feedback terminal of the control module;

The control module generates two voltage signals and a level control signal, wherein a first voltage signal is an aging voltage signal VDC which is output via the first voltage output terminal, a second voltage signal is a reference voltage signal VDD which is output via the second voltage output terminal, the level control signal is a high level or a low level which is output via the control signal output terminal, the initial state of the level control signal is a low level, the aging voltage signal VDC passes through the voltage-controlled oscillator under test to generate an aging frequency signal A, the reference voltage signal VDD passes through the reference voltage-controlled oscillator to generate a reference frequency signal B, the aging frequency signal A is shaped by the first shaping circuit to obtain a first frequency signal $f_{ctr}$, the reference frequency signal B is shaped by the second shaping circuit to generate a second frequency signal $f_{ref}$, the frequency difference circuit obtains a beat frequency signal $f_{out}$ by comparing the first frequency signal $f_{ctr}$ with the second frequency signal $f_{ref}$, the beat frequency signal $f_{out}$ is a difference between the second frequency signal $f_{ref}$ and the first frequency signal $f_{ctr}$, the beat frequency signal $f_{out}$ is outputted to the input terminal of the resolution adjustment circuit from the output terminal of the frequency difference circuit, the output terminal of the resolution adjustment circuit outputs a set signal rst, the set signal rst is a divide-by-2 signal of the beat frequency signal $f_{out}$ when the level control signal accessed to the control terminal of the resolution adjustment circuit is a low level, the set signal rst is a divide-by-4 signal of the beat frequency signal $f_{out}$ when the level control signal accessed to the control terminal of the resolution adjustment circuit is a high level, the set signal rst is accessed to the reset terminal of the 16-bit counter, the 16-bit counter counts the number of the second frequency signals $f_{ref}$ accessed to the set terminal thereof within the cycle of the set signal rst and then outputs the count values as 16 bits of parallel output signals Q0-Q15 in a binary form via 16 bits of parallel output terminals thereof, and the parallel-to-serial circuit converts the 16 bits of parallel output signals Q0-Q15 outputted by the 16-bit counter into serial data Q[0:15] which outputs at the output terminal thereof under the action of the first frequency signal $f_{ref}$;

The adaptive module is pre-stored with a lookup table, the lookup table is obtained by emulating the adaptive anti-aging sensor to artificially simulate the aging process of the voltage-controlled oscillator under test, the specific emulation process is as follows: the first voltage output terminal of the control module is connected to the input terminal of the voltage-controlled oscillator under test, the input terminal of the first shaping circuit is connected to the output terminal of the voltage-controlled oscillator under test, and parameters of the voltage-controlled oscillator under test and parameters of the reference voltage-controlled oscillator are initialize set: a threshold voltage $V_{TP}$ of PMOS transistors is 0.7V, a threshold voltage $V_{TN}$ of NMOS transistors is 0.3V, and a process parameter α of the PMOS transistors and the NMOS transistors is 0.9, a delay time Time of the voltage-controlled oscillator under test under different parameters is measured with Cadence software later, the parameters of the reference voltage-controlled oscillator are maintained to initial values during the measurement process, a regulated range of the threshold voltage $V_{TP}$ of the PMOS transistors of the voltage-controlled oscillator under test is 0.6V-0.8V, the adjustment amount is 1 mV per time, a regulated range of the threshold voltage $V_{TN}$ of the PMOS transistors is 0.2V-0.4V, the adjustment amount is 1 mV per time, a regulated range of the process parameter α of the PMOS transistors and the NMOS transistors is 0.8-1, the adjustment amount is 0.001 per time, the aging voltage signal VDC and the reference voltage signal VDD are both set to 1.2V during each measurement, the level control signal S outputted by the control module is set as a low level firstly, and whether a decimal value corresponding to the 16 bits of parallel output signals Q0-Q15 outputted by the 16-bit counter at this moment is less than 40 is determined, if less than 40, other conditions remain unchanged and the 16 bits of parallel output signals Q0-Q15 outputted by the 16-bit counter at this moment are recorded after adjusting the level control signal S to a high level, if greater than 40, the 16 bits of parallel output signals Q0-Q15 outputted by the 16-bit counter at this moment are recorded directly, the currently recorded 16 bits of parallel output signals Q0-Q15 output by the 16-bit counter are used as an index address of the lookup table, and the corresponding threshold voltage $V_{TP}$, the corresponding threshold voltage $V_{TN}$ and the corresponding process parameter α of the PMOS transistors and the NMOS transistors at this moment are stored in the lookup table as storage data for the index address, and the above measurement process is repeated, if there are the same 16 bits of parallel output signals Q0-Q15 in the subsequent measurement process, one set of corresponding parameters is only recorded, until the decimal value corresponding to the 16 bits of parallel output signals Q0-Q15 outputted by the 16-bit counter appears from 0 to 300, so that the establishing of the lookup table is finished and the lookup table is stored in the adaptive module, there are 301 index addresses in the lookup table at this moment, which respectively correspond to the 16 bits of binary data from 0 to 300;

When the 16 bits of parallel output signals Q0-Q15 outputted by the 16-bit counter are input to the adaptive module, the adaptive module firstly acquires, from the lookup table, storage data $V_{TP}$, $V_{TN}$, α and Time of an index address which is the 16 bits of parallel output signals Q0-Q15 currently inputted into, and then an optimal working voltage of the currently voltage-controlled oscillator under test is determined with adopting to a cuckoo algorithm based on the acquired data $V_{TP}$, $V_{TN}$, α and Time, the specific process is as follows:

A, setting a maximum number of iterations of the cuckoo algorithm as n, wherein n=1000, setting a global optimal solution V;

B, setting an iteration variable, which denotes as s, initializing s, let s=1;

C, performing an $s^{th}$ iteration, specifically as follows:

C-1, generating, with adopting to a random function, 100 voltage data which are within 0-2000 mV and expressed by 16 bits of binary data, wherein an generated $m^{th}$ voltage data is denoted as $V_{DC}^s[m]$, m=1, 2, ..., 100; determining whether $V_{SC}^s[m]$ is equal to $V_{TN}$ or $V_{TP}$, if so, considering $V_{DC}^s[m]$ as a bad value, discarding the value and randomly generating a new $V_{DC}^s[m]$ until 100 voltage data $V_{DC}^s[1]$~$V_{DC}^s[100]$ which are not equal to $V_{TN}$ or $V_{TP}$ are obtained;

C-2, sequentially substituting $V_{DC}^s[1]$~$V_{DC}^s[100]$ into formula $$t_p^s[m] = \alpha \cdot \left( \frac{V_{DC}^s[m]}{(V_{DC}^s[m] - V_{TN})} + \frac{V_{DC}^s[m]}{(V_{DC}^s[m] - V_{TP})} \right)$$

to obtain $t_p^s[1]$~$t_p^s[100]$ by calculation, wherein $t_p^s[m]$ represents an $m^{th}$ aging delay time;

C-3, respectively calculating absolute values of differences between $t_p^s[1]$~$t_p^s[100]$ and Time, denoting the absolute value of the difference between $t_p^s[m]$ and Time as $\text{Diff}^s[m]$, and searching out a minimum value from $\text{Diff}^s[1]$~$\text{Diff}^s[100]$, if multiple identical minimum values appear, randomly selecting one minimum value, and denoting the minimum value as $\text{Diff}^s[i]$, i is an integer greater than or equal to 1 and less than or equal to 100, using voltage data $V_{DC}^s[i]$ corresponding to $\text{Diff}^s[i]$ as an optimal solution $V_{DC}^s$ of a current generation of individuals;

C-4, if the current value of s is 1, assigning the value of the optimal solution $V_{DC}^s$ of the current generation of individuals to the global optimal solution V, updating the global optimal solution V for an $s^{th}$ time to obtain a global optimal solution V subsequent to the $s^{th}$ iteration;

If the current value of s is not 1, comparing $V_{DC}^s$ with a global optimal solution V subsequent to an $(s-1)^{th}$ iteration, if $V_{DC}^s$ is less than the global optimal solution V subsequent to the $(s-1)^{th}$ iteration, updating V with adopting to $V_{DC}^s$ to obtain a global optimal solution V after the $s^{th}$ iteration, if $V_{SC}^s$ is greater than or equal to the global optimal solution V subsequent to the $(s-1)^{th}$ iteration, the value of V is unchanged, directly using the global optimal solution V subsequent to the $(s-1)^{th}$ iteration as the global optimal solution V subsequent to the $s^{th}$ iteration;

C-5, determining whether $\text{Diff}^s[i]$ is equal to 0 or whether s is equal to 1000, if one of them is met, using the global optimal solution V subsequent to the $s^{th}$ iteration as the optimal working voltage $V_{DC}0$-$V_{DC}15$ outputted from the 16 bits of parallel output terminals of the adaptive module, the iteration process is ended, if neither of the two is met, performing C-6;

C-6, updating voltage data $V_{DC}^{s+1}[1]$~$V_{DC}^{s+1}[100]$ generated for an $(s+1)^{th}$ generation with adopting to formula $V_{DC}^{s+1}[m]=V_{DC}^s[m]+\varphi \oplus \text{Levy}(\lambda)$ wherein $\lambda$ is a random number which is generated through an RC4 algorithm and is greater than or equal to 0 and less than or equal to 3, $\lambda$ is needed to regenerate whenever voltage data is generated, $\varphi$ is a step controlled amount, $\varphi=1$, $\oplus$ is dot-to-dot multiplication, $\text{Levy}(\lambda)$ is a random search path, and $\text{Levy}(\lambda)=s^{-\lambda}$, determining whether $V_{DC}^{s+1}[m]$ is equal to $V_{TN}$ or $V_{TP}$, if so, considering $V_{DC}^{s+1}[m]$ as a bad value, discarding the value and randomly regenerating a new $V_{DC}^{s+1}[m]$ by formula $V_{DC}^{s+1}[m]=V_{DC}^s[m]+\varphi \oplus \text{Levy}(\lambda)$ until 100 voltage data $V_{DC}^{s+1}[1]$~$V_{DC}^{s+1}[100]$ which are not equal to $V_{TN}$ or $V_{TP}$ are obtained;

C-7, updating the value of s with adopting to a sum of the current value of s adding 1, repeating the steps from C-2 for the next iteration until the iteration process is ended, so as to obtain the optimal working voltage $V_{DC}0$-$V_{DC}15$ which is outputted from the 16 bits of parallel output terminals of the adaptive module;

The digital-to-analog converter converts the optimal working voltage $V_{DC}0$-$V_{DC}15$ outputted by the adaptive module into an analog voltage to output to the feedback terminal of the control module, and the control module adjusts the magnitude of the aging voltage signal VDC outputted at the first output terminal thereof as the magnitude of the analog voltage outputted at the output terminal of the digital-to-analog converter.

Each of the shaping circuits comprises a first PMOS transistor, a second PMOS transistor, a first NMOS transistor, a second NMOS transistor and a first inverter; a source of the first PMOS transistor and a source of the second PMOS transistor are both accessed to a power source, a gate of the first PMOS transistor, a drain of the second PMOS transistor and a drain of the second NMOS transistor are connected and the connecting terminal is the output terminal of the shaping circuit, a drain of the first PMOS transistor, a gate of the second PMOS transistor and a drain of the first NMOS transistor are connected, a gate of the first NMOS transistor and an input terminal of the first inverter are connected and the connecting terminal is the input terminal of the shaping circuit, an output terminal of the first inverter and a gate of the second NMOS transistor are connected, and a source of the first NMOS transistor and a source of the second NMOS transistor are both grounded.

The frequency difference circuit is realized with adopting to a first D flip-flop, the first D flip-flop has an input terminal, a clock terminal and an output terminal, the input terminal of the first D flip-flop is the set terminal of the frequency difference circuit, the clock terminal of the first D flip-flop is the clock terminal of the frequency difference circuit, and the output terminal of the first D flip-flop is the output terminal of the frequency difference circuit.

The resolution adjustment circuit comprises a first 2-to-1 multiplexer, a second D flip-flop and a third D flip-flop, the first 2-to-1 multiplexer has a first input terminal, a second input terminal, a selection terminal and an output terminal, the second D flip-flop and the third D flip-flop have an input terminal, a clock terminal, an output terminal and an inverted output terminal respectively; the input terminal of the second D flip-flop is connected to the inverted output terminal of the second D flip-flop, the clock terminal of the second D flip-flop is the input terminal of the resolution adjustment circuit, the output terminal of the second D flip-flop, the clock terminal of the third D flip-flop and the first input terminal of the first 2-to-1 multiplexer are connected, the input terminal of the third D flip-flop and the inverted output terminal of the third D flip-flop are connected, the output terminal of the third D flip-flop and the second input terminal of the first 2-to-1 multiplexer are connected, the selection terminal of the first 2-to-1 multiplexer is the control terminal of the resolution adjustment circuit, and the output terminal of the first 2-to-1 multiplexer is the output terminal of the resolution adjustment circuit.

The 16-bit counter comprises 16 D flip-flops and 16 inverters, wherein each of the D flip-flops has an input terminal, a clock terminal, a reset terminal and an output terminal respectively, the reset terminals of the 16 D flip-flops are connected and the connecting terminal is the reset terminal of the 16-bit counter, the input terminal of the $k^{th}$ D flip-flop and the output terminal of the $k^{th}$ inverter are connected, k=1, 2, ..., 16, the output terminal of the $h^{th}$ D flip-flop, the input terminal of the $h^{th}$ inverter and the clock terminal of the $(h+1)^{th}$ D flip-flop are connected and the connecting terminal is the $h^{th}$ output terminal of the 16-bit counter, h=1, 2, ..., 15, the output terminal of the $16^{th}$ D flip-flop and the input terminal of the $16^{th}$ inverter are connected and the connecting terminal is the $16^{th}$ output terminal of the 16-bit counter, the first output terminal to the $16^{th}$ output terminal of the 16-bit counter are the 16 bits of parallel output terminals of the 16-bit counter.

Compared with the prior art, the advantages of the invention is that the adaptive anti-aging sensor is constructed through the control module, the reference voltage oscillator, the two shaping circuits of the same structure, the frequency difference circuit, the resolution adjustment circuit, the 16-bit counter, the parallel-to-serial circuit, the adaptive module and the digital-to-analog converter the adaptive module is pre-stored with a lookup table, the lookup table is obtained by emulating the adaptive anti-aging sensor to artificially simulate the aging process of the voltage-controlled oscillator under test when 16 bits of parallel output signals Q0-Q15 output by the 16-bit counter are input to the adaptive module while monitoring the degree of aging of the voltage-controlled oscillator in the integrated circuits, the adaptive module firstly acquires, from the lookup table, storage data $V_{TP}$, $V_{TN}$, α and Time of an index address which is the 16 bits of parallel output signals Q0-Q15 currently inputted into and then determines an optimal working voltage of the currently voltage-controlled oscillator under test with adopting to a cuckoo algorithm based on the acquired data $V_{TP}$, $V_{TN}$, α and Time, and the optimal working voltage $V_{DC}0$-$V_{DC}15$ is transmitted to the digital-to-analog converter, the digital-to-analog converter converts the optimal working voltage $V_{DC}0$-$V_{DC}15$ into an analog voltage to output to the feedback terminal of the control module, the control module adjusts the magnitude of the aging voltage signal VDC outputted at first output terminal thereof as the magnitude of the analog voltage outputted at the output terminal of the digital-to-analog converter, so as to change an input voltage of the voltage-controlled oscillator of an integrated circuit. Thus, the adaptive anti-aging sensor of the invention can reflect the degree of aging of integrated circuits by monitoring the degree of aging of the voltage-controlled oscillator in the integrated circuits, can adaptively adjust the optimal working voltage of the voltage-controlled oscillator in the integrated circuits according to the aging state of the voltage-controlled oscillator in the integrated circuits, can adaptively repairing the voltage-controlled oscillator in the integrated circuits, can meet the repairing of the aging of the integrated circuits under different degrees of aging, so as to finally achieve the purpose of anti-aging of the integrated circuits, and have a wide application range.

DESCRIPTION OF EMBODIMENTS

The invention will be described in further detail below in conjunction with the accompanying drawings and embodiments.

Figure 1:
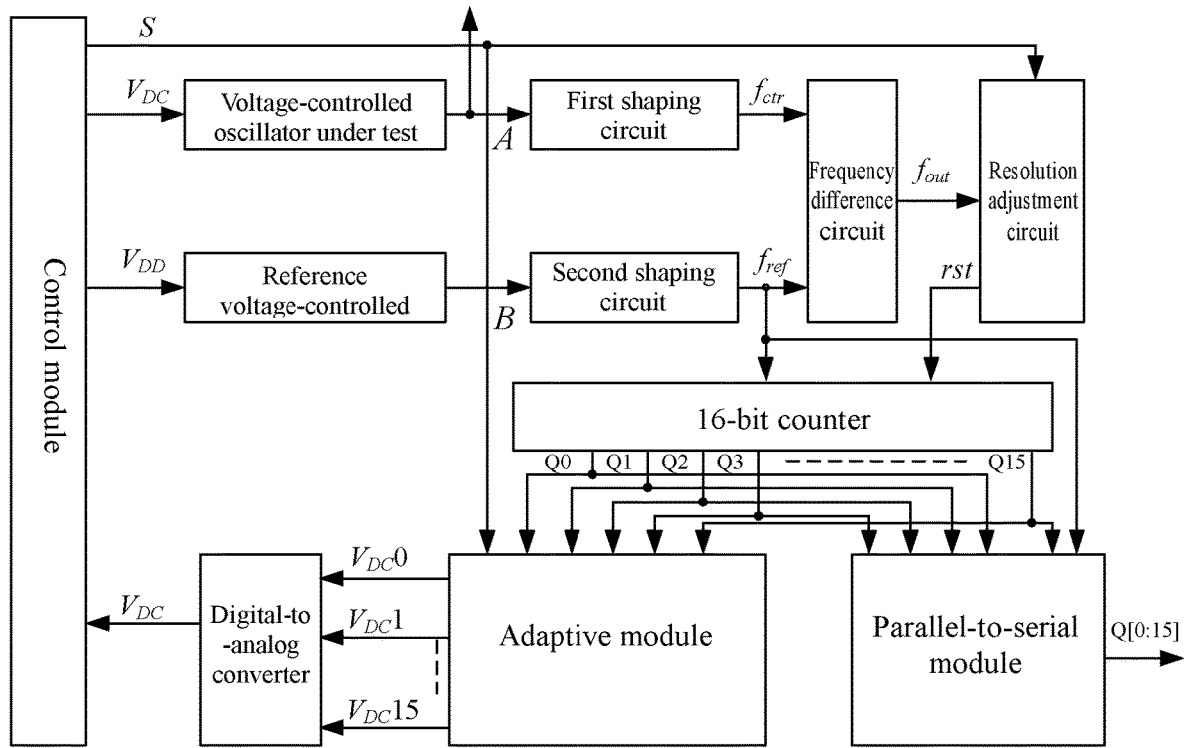
FIG. 1 is a structural block diagram of an adaptive anti-aging sensor based on a cuckoo algorithm according to the invention.

Embodiment: as shown in FIG. 1, an adaptive anti-aging sensor based on a cuckoo algorithm comprises a control module, a reference voltage-controlled oscillator, two shaping circuits of the same structure, a frequency difference circuit, a resolution adjustment circuit, a 16-bit counter, a parallel-to-serial circuit, an adaptive module and a digital-to-analog converter; the control module has a feedback terminal, a first voltage output terminal, a second voltage output terminal and a control signal output terminal, the reference voltage-controlled oscillator and each shaping circuit have an input terminal and an output terminal respectively, the frequency difference circuit has a set terminal, a clock terminal and an output terminal, the resolution adjustment circuit has an input terminal, an output terminal and a control terminal, the 16-bit counter has a set terminal, a reset terminal and 16 bits of parallel output terminals, the adaptive module has a control terminal, 16 bits of parallel input terminals and 16 bits of parallel output terminals, the digital-to-analog converter has 16 bits of parallel input terminals and an output terminal, the parallel-to-serial module has a clock terminal, 16 bits of parallel input terminals and an output terminal, the two shaping circuits are referred to as a first shaping circuit and a second shaping circuit respectively, a voltage-controlled oscillator in an integrated circuit is referred to as a voltage-controlled oscillator under test, the reference voltage-controlled oscillator is completely identical with the voltage-controlled oscillator under test, the first voltage output terminal of the control module is used for connecting to an input terminal of the voltage-controlled oscillator under test, the second voltage output terminal of the control module is connected to the input terminal of the reference voltage-controlled oscillator, the control signal output terminal of the control module is connected to the control terminal of the resolution adjustment circuit and the control terminal of the adaptive module respectively, the input terminal of the first shaping circuit is used for connecting to an output terminal of the voltage-controlled oscillator under test, the output terminal of the reference voltage-controlled oscillator is connected to the input terminal of the second shaping circuit, the output terminal of the first shaping circuit is connected to the set terminal of the frequency difference circuit, the output terminal of the second shaping circuit is connected to the clock terminal of the frequency difference circuit, the clock terminal of the parallel-to-serial module and the set terminal of the 16-bit counter respectively, the output terminal of the frequency difference circuit is connected to the input terminal of the resolution adjustment circuit, the output terminal of the resolution adjustment circuit is connected to the reset terminal of the 16-bit counter, the 16 bits of parallel output terminals of the 16-bit counter are connected to the 16 bits of parallel input terminals of the parallel-to-serial module and the 16 bits of parallel input terminals of the adaptive module respectively, the 16 bits of parallel output terminals of the adaptive module are connected to the 16 bits of parallel input terminals of the digital-to-analog converter, and the output terminal of the digital-to-analog converter is connected to the feedback terminal of the control module; the control module generates two voltage signals and a level control signal, wherein a first voltage signal is an aging voltage signal VDC which is outputted via the first voltage output terminal thereof, a second voltage signal is a reference voltage signal VDD which is outputted via the second voltage output terminal thereof, the level control signal is a high level or a low level which is outputted via the control signal output terminal thereof, the initial state of the level control signal is a low level, the aging voltage signal VDC passes through the voltage-controlled oscillator under test to generate an aging frequency signal A, the reference voltage signal VDD passes through the reference voltage-controlled oscillator to generate a reference frequency signal B, the aging frequency signal A is shaped by the first shaping circuit to obtain a first frequency signal $f_{ctr}$, the reference frequency signal B is shaped by the second shaping circuit to generate a second frequency signal $f_{ref}$, the frequency difference circuit obtains a beat frequency signal $f_{out}$ by comparing the first frequency signal $f_{ctr}$ with the second frequency signal $f_{ref}$, the beat frequency signal $f_{out}$ is a difference between the second frequency signal $f_{ref}$ and the first frequency signal $f_{ctr}$, the beat frequency signal $f_{out}$ is output to the input terminal of the resolution adjustment circuit from the output terminal of the frequency difference circuit, and the output terminal of the resolution adjustment circuit outputs a set signal rst, the set signal rst is a divide-by-2 signal of the beat frequency signal $f_{out}$ when the level control signal accessed to the control terminal of the resolution adjustment circuit is the low level, the set signal rst is a divide-by-4 signal of the beat frequency signal $f_{out}$ when the level control signal accessed to the control terminal of the resolution adjustment circuit is the high level, the reset terminal of the 16-bit counter is accessed to the set signal rst, the 16-bit counter counts the number of the second frequency signals $f_{ref}$ accessed to the set terminal thereof within the cycle of the set signal rst and then outputs the count value as 16 bits of parallel output signals Q0-Q15 in a binary form at the 16 bits of parallel output terminals thereof, and the parallel-to-serial circuit converts the 16 bits of parallel output signals Q0-Q15 output by the 16-bit counter into serial data Q[0:15] which outputted as the output terminal thereof under the action of the first frequency signal $f_{ref}$;

The adaptive module is pre-stored with a lookup table, the lookup table is obtained by emulating the adaptive anti-aging sensor to artificially simulate the aging process of the voltage-controlled oscillator under test, the specific emulation process is as follows: the first voltage output terminal of the control module is connected to the input terminal of the voltage-controlled oscillator under test, the input terminal of the first shaping circuit is connected to the output terminal of the voltage-controlled oscillator under test, and parameters of the voltage-controlled oscillator under test and parameters of the reference voltage-controlled oscillator are initialize set: a threshold voltage $V_{TP}$ of PMOS transistors is 0.7V, a threshold voltage $V_{TN}$ of NMOS transistors is 0.3V, and a process parameter α of the PMOS transistors and the NMOS transistors is 0.9; a delay time Time of the voltage-controlled oscillator under test under different parameters is measured with Cadence software later, the parameters of the reference voltage-controlled oscillator are maintained to initial values during the measurement process, a regulated range of the threshold voltage $V_{TP}$ of the PMOS transistors of the voltage-controlled oscillator under test is 0.6V-0.8V, the adjustment amount is 1 mV per time, a regulated range of the threshold voltage $V_{TN}$ of the NMOS transistors is 0.2V-0.4V, the adjustment amount is 1 mV per time, a regulated range of the process parameter α of the PMOS transistors and the NMOS transistors is 0.8-1, the adjustment amount is 0.001 per time, the aging voltage signal VDC and the reference voltage signal VDD are set to 1.2V during each measurement, the level control signal S outputted by the control module is set as a low level firstly, whether a decimal value corresponding to the 16 bits of parallel output signals Q0-Q15 outputted by the 16-bit counter at this moment is less than 40 is determined, if less than 40, other conditions remain unchanged, and the 16 bits of parallel output signals Q0-Q15 outputted by the 16-bit counter at this moment are recorded after adjusting the level control signal S to a high level, if greater than 40, the 16 bits of parallel output signals Q0-Q15 outputted by the 16-bit counter at this moment are recorded directly, the currently recorded 16 bits of parallel output signals Q0-Q15 outputted by the 16-bit counter are used as an index address of the lookup table, and the corresponding threshold voltage $V_{TP}$, the corresponding threshold voltage $V_{TN}$ and the corresponding process parameter α of the PMOS transistors and the NMOS transistors at this moment are stored in the lookup table as storage data for the index address, and the above measurement process is repeated, if there are the same 16 bits of parallel output signals Q0-Q15 in the subsequent measurement process, one set of corresponding parameters is only recorded until the decimal value corresponding to the 16 bits of parallel output signals Q0-Q15 outputted by the 16-bit counter appears from 0 to 300, so that the establishing of the lookup table is finished and the lookup table is stored in the adaptive module, there are 301 index addresses in the lookup table at this moment, which respectively correspond to the 16 bits of binary data from 0 to 300;

When the 16 bits of parallel output signals Q0-Q15 output by the 16-bit counter are input to the adaptive module, the adaptive module firstly acquires, from the lookup table, storage data $V_{TP}$, $V_{TN}$, α and Time of an index address which is the 16 bits of parallel output signals Q0-Q15 currently inputted into, and then determines an optimal working voltage of the currently voltage-controlled oscillator under test through a cuckoo algorithm based on the acquired data $V_{TP}$, $V_{TN}$, α and Time. The specific process is as follows:

A, a maximum number of iterations of the cuckoo algorithm is set as n, wherein n=1000, a global optimal solution V is set;

B, an iteration variable is set, which denotes as s, s is initialized, let s=1;

C, an $s^{th}$ iteration is performed, specifically as follows:

C-1, 100 voltage data which are within 0-2000 mV and expressed by 16 bits of binary data are generated by a random function, wherein an generated $m^{th}$ voltage data is denoted as $V_{DC}^s[m]$, and m=1, 2, . . . , 100; whether $V_{DC}^s[m]$ is equal to $V_{TN}$ or $V_{TP}$ is determined; if so, $V_{DC}^s[m]$ is considered as a bad value the value is discarded and a new $V_{DC}^s[m]$ is randomly generated until 100 voltage data $V_{DC}^s[1]$~$V_{DC}^s[100]$ which are not equal to $V_{TN}$ or $V_{TP}$ are obtained;

C-2, $V_{DC}^s[1]$~$V_{DC}^s[100]$ are sequentially substituted into formula $$t_p^s[m] = \alpha \cdot \left( \frac{V_{DC}^s[m]}{(V_{DC}^s[m] - V_{TN})} + \frac{V_{DC}^s[m]}{(V_{DC}^s[m] - V_{TP})} \right)$$

to obtain is $t_p^s[1]$~$t_p^s[100]$ by calculation, wherein $t_p^s[m]$ represents an $m^{th}$ aging delay time;

C-3, absolute values of differences between $t_p^s[1]$~$t_p^s[100]$ and Time are calculated respectively, the absolute value of the difference between $t_p^s[m]$ and Time is denoted as Diff$^s$[m], and a minimum value is searched out from Diff$^s$[1]~Diff$^s$[100], if multiple identical minimum values appear, one minimum value is selected randomly, the minimum value is denoted as Diff$^s$[i], i is an integer greater than or equal to 1 and less than or equal to 100, voltage data $V_{DC}^s[i]$ corresponding to Diff$^s$[i] is used as an optimal solution $V_{DC}$ of a current generation of individuals;

C-4, if the current value of s is 1, the value of the optimal solution $V_{DC}^s$ of the current generation of individuals is assigned to the global optimal solution V, the global optimal solution V is updated for an $s^{th}$ time to obtain a global optimal solution V subsequent to the $s^{th}$ iteration;

If the current value of s is not 1, $V_{DC}^s$ is compared with a global optimal solution V subsequent to an $(s-1)^{th}$ iteration, if $V_{DC}^s$ is less than the global optimal solution V subsequent to the $(s-1)^{th}$ iteration, V is updated with adopting to $V_{DC}^s$ to obtain a global optimal solution V subsequent to the $s^{th}$ iteration, if $V_{DC}^s$ is greater than or equal to the global optimal solution V subsequent to the $(s-1)^{th}$ iteration, the value of V is unchanged, and the global optimal solution V subsequent to the $(s-1)^{th}$ iteration is directly used as the global optimal solution V which the $s^{th}$ iteration;

C-5, whether Diff$^s$[i] is equal to 0 or whether s is equal to 1000 is determined, if one of them is met, the global optimal solution V subsequent to the $s^{th}$ iteration which used as the optimal working voltage $V_{DC}0$-$V_{DC}15$ is outputted from the 16 bits of parallel output terminals of the adaptive module, the iteration process is ended, if neither of the two is met, C-6 is performed;

C-6, a generated voltage data $V_{DC}^{s+1}[1]$~$V_{SC}^{s+1}[100]$ of an $(s+1)^{th}$ generation is updated with adopting to formula $V_{DC}^{s+1}[m]=V_{DC}^s[m]+\varphi \oplus Levy(\lambda)$ wherein $\lambda$ is a random number which is generated through an RC4 algorithm and is greater than or equal to 0 and less than or equal to 3, $\lambda$ is regenerated whenever voltage data is generated, $\varphi$ is a step controlled amount, $\varphi=1$, $\oplus$ is dot-to-dot multiplication, Levy($\lambda$) is a random search path, and Levy($\lambda$)=$s^{-\lambda}$; whether $V_{DC}^{s+1}[m]$ is equal to $V_{TN}$ or $V_{TP}$ is determined, if so, $V_{DC}^{s+1}[m]$ is considering as a bad value, the value is discarded, a new $V_{DC}^{s+1}[m]$ is regenerated randomly by formula $V_{DC}^{s+1}[m]=V_{DC}^s[m]+\varphi \oplus Levy(\lambda)$ until 100 voltage data $V_{DC}^{s+1}[1]$~$V_{DC}^{s+1}[100]$ which are not equal to $V_{TN}$ or $V_{TP}$ are obtained;

C-7, the value of s is updated with adopting to a sum of the current value of s adding 1, the steps is repeated from C-2 for the next iteration until the iteration process is ended, so as to obtain the optimal working voltage $V_{DC}0$-$V_{DC}15$, which is outputted from the 16 bits of parallel output terminals of the adaptive module;

The digital-to-analog converter converts the optimal working voltage $V_{DC}0$-$V_{DC}15$ outputted by the adaptive module into an analog voltage to output to the feedback terminal of the control module, the control module adjusts the magnitude of the aging voltage signal VDC outputted at the first output terminal thereof to as the magnitude of the analog voltage outputted at the output terminal of the digital-to-analog converter.

Figure 2:
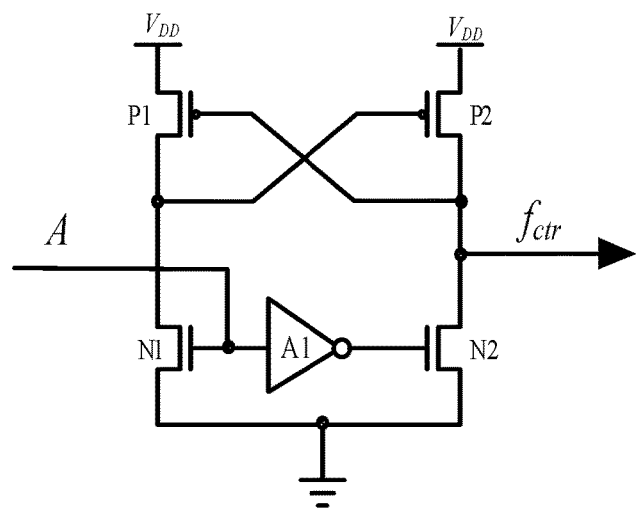
FIG. 2 is a circuit diagram of a shaping circuit of the adaptive anti-aging sensor based on a cuckoo algorithm according to the invention.

In this embodiment, as shown in FIG. 2, Each shaping circuit comprises a first PMOS transistor P1, a second PMOS transistor P2, a first NMOS transistor N1, a second NMOS transistor N2 and a first inverter A1; a source of the first PMOS transistor P1 and a source of the second PMOS transistor P2 are both accessed to a power source, a gate of the first PMOS transistor P1, a drain of the second PMOS transistor P2 and a drain of the second NMOS transistor N2 are connected and the connecting terminal is the output terminal of the shaping circuit, a drain of the first PMOS transistor P1, a gate of the second PMOS transistor P2 and a drain of the first NMOS transistor N1 are connected, a gate of the first NMOS transistor N1 and an input terminal of the first inverter A1 are connected and the connecting terminal is the input terminal of the shaping circuit, an output terminal of the first inverter A1 and a gate of the second NMOS transistor N2 are connected, and a source of the first NMOS transistor N1 and a source of the second NMOS transistor N2 are both grounded.

Figure 3:
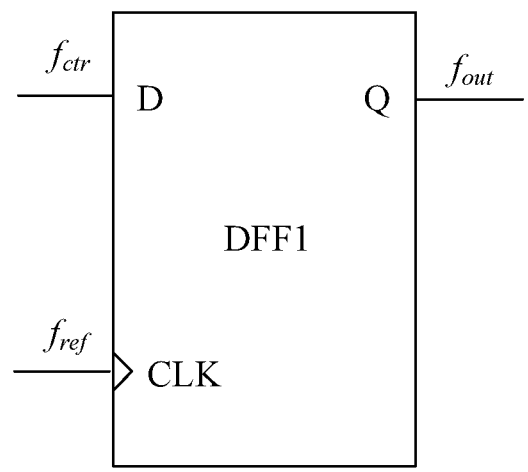
FIG. 3 is a circuit diagram of a frequency difference circuit of the adaptive anti-aging sensor based on a cuckoo algorithm according to the invention.

In this embodiment, as shown in FIG. 3, the frequency difference circuit is realized with adopting to a first D flip-flop DFF1, the first D flip-flop DFF1 has an input terminal, a clock terminal and an output terminal, the input terminal of the first D flip-flop DFF1 is the set terminal of the frequency difference circuit, the clock terminal of the first D flip-flop DFF1 is the clock terminal of the frequency difference circuit, and the output terminal of the first D flip-flop DFF1 is the output terminal of the frequency difference circuit.

Figure 4:
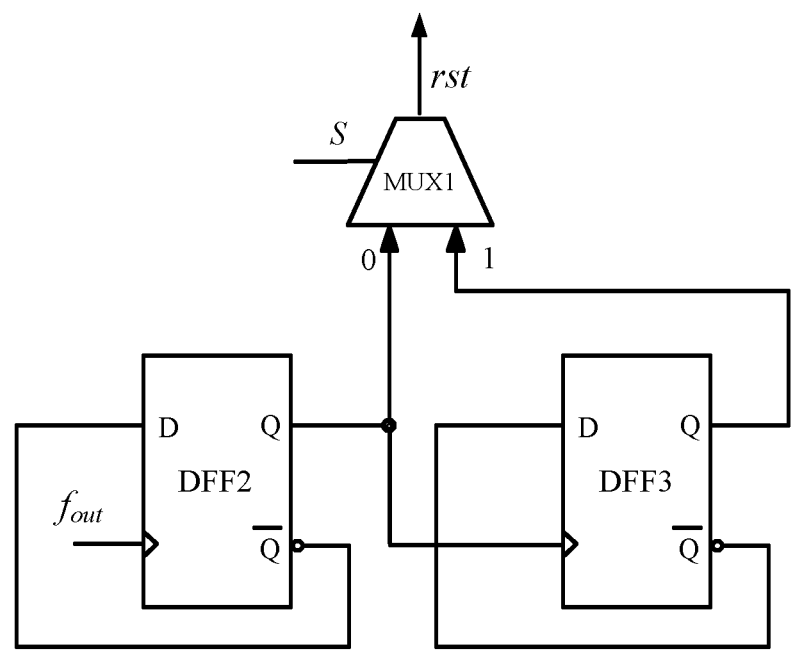
FIG. 4 is a circuit diagram of a resolution adjustment circuit of the adaptive anti-aging sensor based on a cuckoo algorithm according to the invention.

In this embodiment, as shown in FIG. 4, the resolution adjustment circuit comprises a first 2-to-1 multiplexer MUX1, a second D flip-flop DFF2 and a third D flip-flop DFF3, the first 2-to-1 multiplexer MUX1 has a first input terminal, a second input terminal, a selection terminal and an output terminal, the second D flip-flop DFF2 and the third D flip-flop DFF3 have an input terminal, a clock terminal, an output terminal and an inverted output terminal respectively; the input terminal of the second D flip-flop DFF2 is connected to the inverted output terminal of the second D flip-flop DFF2, the clock terminal of the second D flip-flop DFF2 is the input terminal of the resolution adjustment circuit, the output terminal of the second D flip-flop DFF2, the clock terminal of the third D flip-flop DFF3 and the first input terminal of the first 2-to-1 multiplexer MUX1 are connected, the input terminal of the third D flip-flop DFF3 and the inverted output terminal of the third D flip-flop DFF3 are connected, the output terminal of the third D flip-flop DFF3 and the second input terminal of the first 2-to-1 multiplexer MUX1 are connected, the selection terminal of the first 2-to-1 multiplexer MUX1 is the control terminal of the resolution adjustment circuit, and the output terminal of the first 2-to-1 multiplexer NUX1 is the output terminal of the resolution adjustment circuit.

Figure 5:
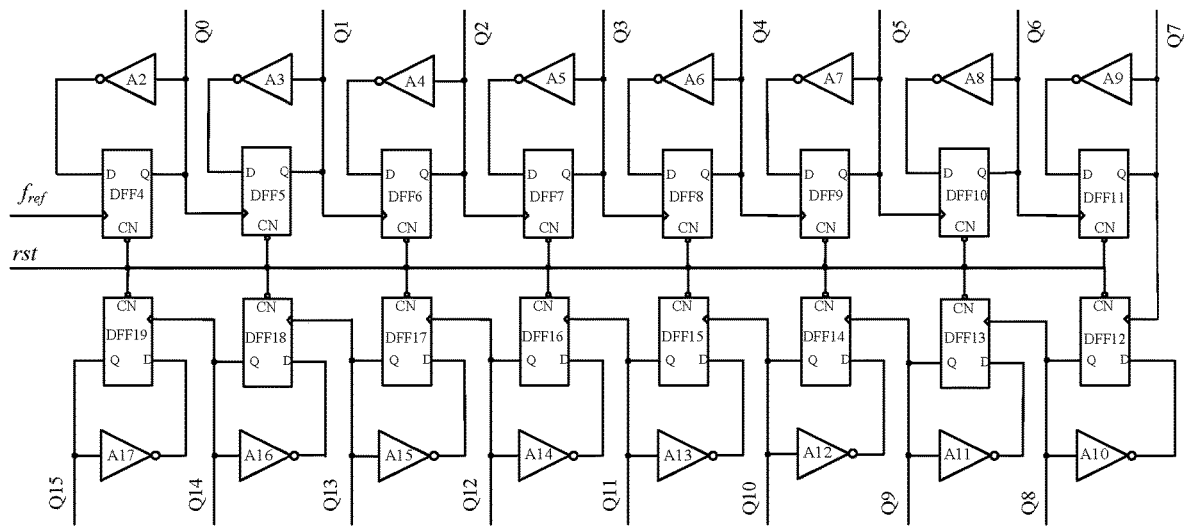
FIG. 5 is a circuit diagram of a 16-bit counter of the adaptive anti-aging sensor based on a cuckoo algorithm according to the invention.

In this embodiment, as shown in FIG. 5, the 16-bit counter comprises 16 D flip-flops DFF4-DFF19 and 16 inverters A2-A17, each D flip-flop has an input terminal, a clock terminal, a reset terminal and an output terminal, the reset terminals of the 16 D flip-flops are connected and the connecting terminal is the reset terminal of the 16-bit counter, the input terminal of the $k^{th}$ D flip-flop and the output terminal of the $k^{th}$ inverter are connected, k=1, 2, ..., 16, the output terminal of the $h^{th}$ D flip-flop, the input terminal of the $h^{th}$ inverter and the clock terminal of the $(h+1)^{th}$ D flip-flop are connected and the connecting terminal is the $h^{th}$ output terminal of the 16-bit counter, h=1, 2, ..., 15, the output terminal of the $16^{th}$ D flip-flop and the input terminal of the $16^{th}$ inverter are connected and the connecting terminal is the $16^{th}$ output terminal of the 16-bit counter, and the first output terminal to the $16^{th}$ output terminal of the 16-bit counter are the 16 bits of parallel output terminals of the 16-bit counter.

Figure 6:
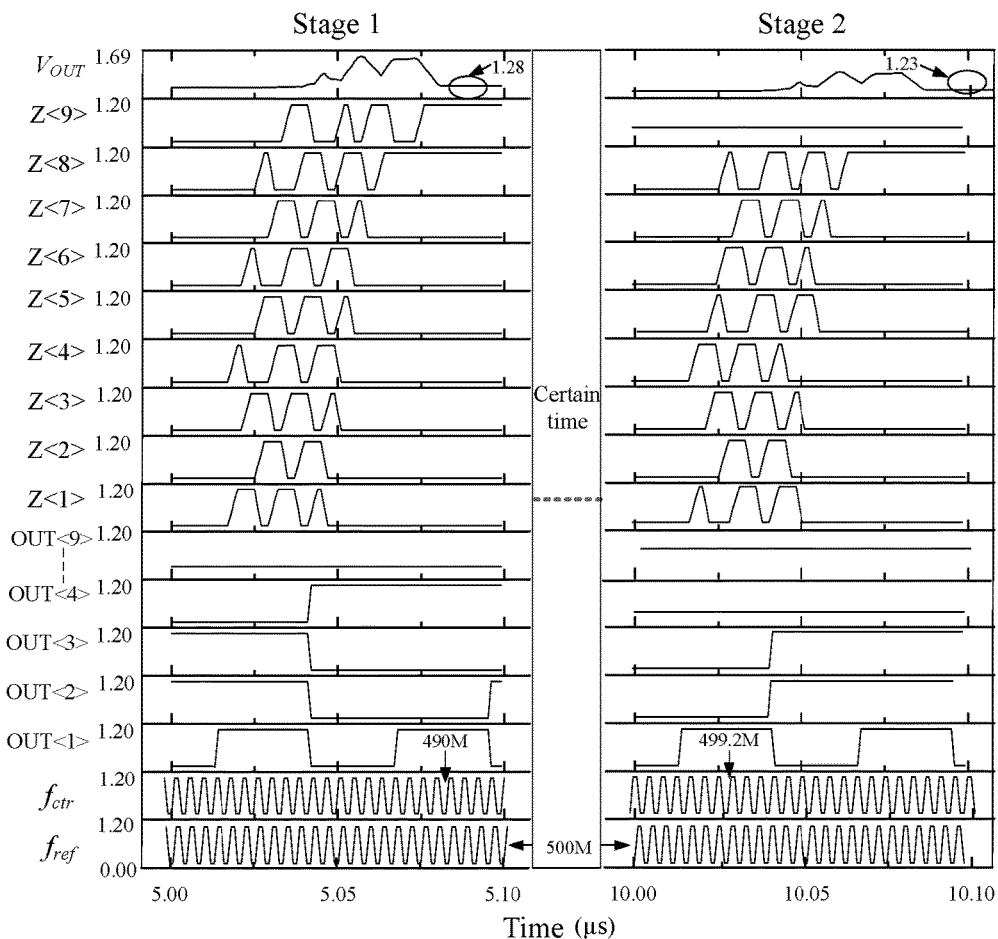
FIG. 6 is an analog simulation diagram of the adaptive anti-aging sensor based on a cuckoo algorithm according to the invention.

The aging monitoring process of the adaptive anti-aging sensor based on a cuckoo algorithm provided by the invention is simulated, and an analog simulation curve is shown in FIG. 6. In FIG. 6, $f_{ctr}$ is an output obtained after an aging frequency generated by the voltage-controlled oscillator under test is shaped by the first shaping circuit, $f_{ref}$ is an output obtained after a reference frequency generated by the reference voltage-controlled oscillator is shaped by the second shaping circuit, OUT<1>, OUT<2>, ... and OUT<9> are respectively 16 bits of parallel output signals output by the 16-bit counter, Z<1>, Z<2>, and Z<9> are the optimal working voltage outputted from the adaptive module respectively, and $V_{OUT}$ is the analog voltage outputted after digital-to-analog conversion is performed by the digital-to-analog converter. As can be known by analyzing FIG. 6, the aging monitoring repairing process is approximately divided into two stages: in the first stage: the adaptive module gives an optimal regulating voltage (namely the optimal working voltage) needed for restoring the performance of the currently voltage-controlled oscillator under test according to the degree of aging thereof, in the second stage: the voltage of the voltage-controlled oscillator under test is regulated according to the optimal regulating voltage to realize adaptive repair of the performance of the integrated circuit being degraded due to aging. The specific simulation process is as follows: in the simulation state, the reference voltage-controlled oscillator generates a reference frequency signal of 500 M, the voltage-controlled oscillator under test generates a aging frequency signal of 490 M, the frequency of the voltage-controlled oscillator under test is degraded by 2% with respect to the reference voltage-controlled oscillator, at this moment, a decimal number corresponding to the 16 bits of data outputted at the 16 bits of parallel output terminals of the 16-bit counter is 80, that is, the output of the 16-bit counter is 80, the output of the 16-bit counter is used as an input of the adaptive module, the optimal working voltage in the current aging state obtained by optimization through the cuckoo algorithm is 1.28V, and the optimal working voltage is output to the control module as a feedback voltage of the voltage-controlled oscillator under test; after the control module regulates the working voltage of the voltage-controlled oscillator under test accordingly, an output of the 16-bit counter is 275 at this moment, an output frequency of the voltage-controlled oscillator under test is 499.2 M, the degradation with respect to the frequency of the reference voltage-controlled oscillator is 0.16%, and the output voltage is 1.23V. The simulation result shows that, the aging frequency output of the voltage-controlled oscillator under test is increased after optimizing through an adaptive algorithm, the performance of the integrated circuit is restored obviously, and adaptive anti-aging function of the integrated circuit is realized.

What is claimed is:

1. An adaptive anti-aging sensor based on a cuckoo algorithm, comprises a control module, a reference voltage-controlled oscillator, two shaping circuits of the same structure, a frequency difference circuit, a resolution adjustment circuit, a 16-bit counter, a parallel-to-serial circuit, an adaptive module and a digital-to-analog converter; the control module has a feedback terminal, a first voltage output terminal, a second voltage output terminal and a control signal output terminal, the reference voltage-controlled oscillator and each of the shaping circuits have an input terminal and an output terminal respectively, the frequency difference circuit has a set terminal, a clock terminal and an output terminal, the resolution adjustment circuit has an input terminal, an output terminal and a control terminal, the 16-bit counter has a set terminal, a reset terminal and 16 bits of parallel output terminals, the adaptive module has a control terminal, 16 bits of parallel input terminals and 16 bits of parallel output terminals, the digital-to-analog converter has 16 bits of parallel input terminals and an output terminal, the parallel-to-serial circuit has a clock terminal, 16 bits of parallel input terminals and an output terminal, the two shaping circuits are referred to as a first shaping circuit and a second shaping circuit respectively, a voltage-controlled oscillator in an integrated circuit is referred to as a voltage-controlled oscillator under test, the reference voltage-controlled oscillator is completely identical with the voltage-controlled oscillator under test, the first voltage output terminal of the control module is used for connecting to an input terminal of the voltage-controlled oscillator under test, the second voltage output terminal of the control module is connected to the input terminal of the reference voltage-controlled oscillator, the control signal output terminal of the control module is connected to the control terminal of the resolution adjustment circuit and the control terminal of the adaptive module respectively, the input terminal of the first shaping circuit is connected to an output terminal of the voltage-controlled oscillator under test, the output terminal of the reference voltage-controlled oscillator is connected to the input terminal of the second shaping circuit, the output terminal of the first shaping circuit is connected to the set terminal of the frequency difference circuit, the output terminal of the second shaping circuit is connected to the clock terminal of the frequency difference circuit, the clock terminal of the parallel-to-serial circuit and the set terminal of the 16-bit counter respectively, the output terminal of the frequency difference circuit is connected to the input terminal of the resolution adjustment circuit, the output terminal of the resolution adjustment circuit is connected to the reset terminal of the 16-bit counter, the 16 bits of parallel output terminals of the 16-bit counter are connected to the 16 bits of parallel input terminals of the parallel-to-serial circuit and the 16 bits of parallel input terminals of the adaptive module respectively, the 16 bits of parallel output terminals of the adaptive module are connected to the 16 bits of parallel input terminals of the digital-to-analog converter, and the output terminal of the digital-to-analog converter is connected to the feedback terminal of the control module; the control module generates two voltage signals and a level control signal, wherein a first voltage signal is an aging voltage signal VDC which is outputted via the first voltage output terminal, a second voltage signal is a reference voltage signal VDD which is outputted via the second voltage output terminal, the level control signal is a high level or a low level which is outputted via the control signal output terminal, an initial state of the level control signal is the low level, the aging voltage signal VDC passes through the voltage-controlled oscillator under test to generate an aging frequency signal A, the reference voltage signal VDD passes through the reference voltage-controlled oscillator to generate a reference frequency signal B, the aging frequency signal A is shaped by the first shaping circuit to obtain a first frequency signal $f_{ctr}$, the reference frequency signal B is shaped by the second shaping circuit to generate a second frequency signal $f_{ref}$, the frequency difference circuit obtains a beat frequency signal $f_{out}$ by comparing the first frequency signal $f_{ctr}$ with the second frequency signal $f_{ref}$, the beat frequency signal $f_{out}$ is a difference between the second frequency signal $f_{ref}$ and the first frequency signal $f_{ctr}$, the beat frequency signal $f_{out}$ is output to the input terminal of the resolution adjustment circuit from the output terminal of the frequency difference circuit, the output terminal of the resolution adjustment circuit outputs a set signal rst, the set signal rst is a divide-by-2 signal of the beat frequency signal $f_{out}$ when the level control signal accessed to the control terminal of the resolution adjustment circuit is the low level, the set signal rst is a divide-by-4 signal of the beat frequency signal $f_{out}$ when the level control signal accessed to the control terminal of the resolution adjustment circuit is the high level, the set signal rst is accessed to the reset terminal of the 16-bit counter, the 16-bit counter counts the second frequency signals $f_{ref}$ accessed to the set terminal of the 16-bit counter within a cycle of the set signal rst and then outputs a count value as 16 bits of parallel output signals Q0-Q15 in a binary form via the 16 bits of parallel output terminals of the 16-bit counter, and the parallel-to-serial circuit converts the 16 bits of parallel output signals Q0-Q15 outputted by the 16-bit counter into serial data Q[0:15] which outputs at the output terminal of the parallel-to-serial circuit under an action of the first frequency signal $f_{ref}$;

the adaptive module is pre-stored with a lookup table, the lookup table is obtained by emulating the adaptive anti-aging sensor to artificially simulate a aging process of the voltage-controlled oscillator under test, a specific emulation process is as follows: the first voltage output terminal of the control module is connected to the input terminal of the voltage-controlled oscillator under test, the input terminal of the first shaping circuit is connected to the output terminal of the voltage-controlled oscillator under test, and parameters of the voltage-controlled oscillator under test and parameters of the reference voltage-controlled oscillator are initialize set: a threshold voltage $V_{TP}$ of PMOS transistors is 0.7V, a threshold voltage $V_{TN}$ of NMOS transistors is 0.3V, and α process parameter α of the PMOS transistors and the NMOS transistors is 0.9; a delay time Time of the voltage-controlled oscillator under test under different parameters is measured with Cadence software later, the parameters of the reference voltage-controlled oscillator are maintained to initial values during a measurement process, a regulated range of the threshold voltage $V_{TP}$ of the PMOS transistors of the voltage-controlled oscillator under test is 0.6V-0.8V and an adjustment amount is 1 mV per time, a regulated range of the threshold voltage $V_{TN}$ of the PMOS transistors is 0.2V-0.4V and an adjustment amount is 1 mV per time, a regulated range of the process parameter a of the PMOS transistors and the NMOS transistors is 0.8-1 and an adjustment amount is 0.001 per time, the aging voltage signal VDC and the reference voltage signal VDD are both set to 1.2V during each measurement, the level control signal S outputted by the control module is set as the low level firstly, whether a decimal value corresponding to the 16 bits of parallel output signals Q0-Q15 outputted by the 16-bit counter at this moment is less than 40 is determined; if less than 40, other conditions remain unchanged, the 16 bits of parallel output signals Q0-Q15 output by the 16-bit counter at this moment are recorded after the level control signal S is adjusted to the high level, if greater than 40, the 16 bits of parallel output signals Q0-Q15 outputted by the 16-bit counter at this moment are recorded directly, the currently recorded 16 bits of parallel output signals Q0-Q15 outputted by the 16-bit counter are used as an index address of the lookup table, and the corresponding threshold voltage $V_{TP}$, the corresponding threshold voltage $V_{TN}$ and the corresponding process parameter α of the PMOS transistors and the NMOS transistors at this moment are stored in the lookup table as storage data for the index address, and the above measurement process is repeated, if there are the same 16 bits of parallel output signals Q0-Q15 in a subsequent measurement process, one set of corresponding parameters needs is only recorded until the decimal value corresponding to the 16 bits of parallel output signals Q0-Q15 outputted by the 16-bit counter appears from 0 to 300, so that establishing of the lookup table is finished and the lookup table is stored in the adaptive module, there are 301 index addresses in the lookup table at this moment, which respectively correspond to 16 bits of binary data from 0 to 300, exist in the lookup table;

when the 16 bits of parallel output signals Q0-Q15 outputted by the 16-bit counter are input to the adaptive module, the adaptive module firstly acquires, from the lookup table, storage data $V_{TP}$, $V_{TN}$, α and Time of an index address which is the 16 bits of parallel output signals Q0-Q15 currently inputted into, and then determines an optimal working voltage of the currently voltage-controlled oscillator under test through a cuckoo algorithm based on the acquired storage data $V_{TP}$, $V_{TN}$, α and Time, a specific process is as follows:

A, setting a maximum number of iterations of the cuckoo algorithm as n, wherein n=1000, setting a global optimal solution V;

B, setting an iteration variable, which denotes as s, initializing s, wherein s=1;

C, performing an $s^{th}$ iteration, specifically as follows:

C-1, generating, with adopting to a random function, 100 voltage data which are within 0-2000 mV and expressed by 16 bits of binary data, an $m^{th}$ voltage data is denoted as $V_{DC}^{s}[m]$, m=1, 2, ..., 100; determining whether $V_{DC}^{s}[m]$ is equal to $V_{TN}$ or $V_{TP}$, if so, considering $V_{DC}^{s}[m]$ as a bad value, discarding the bad value, and randomly generating a new $V_{DC}^{s}[m]$ until 100 voltage data $V_{DC}^{s}[1]$~$V_{DC}^{s}[100]$ which are not equal to $V_{TN}$ or $V_{TP}$ are obtained;

C-2, sequentially substituting $V_{DC}^{s}[1]$~$V_{DC}^{s}[100]$ into formula $$t_p^s[m] = \alpha \cdot \left( \frac{V_{DC}^s[m]}{(V_{DC}^s[m] - V_{TN})} + \frac{V_{DC}^s[m]}{(V_{DC}^s[m] - V_{TP})} \right)$$

to obtain $t_p^s[1]$~$t_p^s[100]$ by calculation, wherein $t_p^s[m]$ represents an $m^{th}$ aging delay time;

C-3, respectively calculating absolute values of differences between $t_p^s[1]$~$t_p^s[100]$ and Time, denoting the absolute value of the difference between $t_p^s[m]$ and Time as $Diff^s[m]$, and searching out a minimum value from $Diff^s[1]$~$Diff^s[100]$, if multiple identical minimum values appear, randomly selecting one minimum value, and denoting the minimum value as $Diff^s[i]$, i is an integer greater than or equal to 1 and less than or equal to 100, using voltage data $V_{DC}^s[i]$ corresponding to $Diff^s[i]$ as an optimal solution $V_{DC}^s$ of a current generation of individuals;

C-4, if a current value of s is 1, assigning the value of the optimal solution $V_{DC}^s$ of the current generation of individuals to the global optimal solution V, updating the global optimal solution V for an $s^{th}$ time to obtain a global optimal solution V subsequent to the $s^{th}$ iteration;

if the current value of s is not 1, comparing $V_{DC}^s$ with a global optimal solution V subsequent to an $(s-1)^{th}$ iteration, if $V_{DC}^s$ is less than the global optimal solution V subsequent to the $(s-1)^{th}$ iteration, updating V with adopting to a value of $V_{DC}^s$ to obtain a global optimal solution V subsequent to the $s^{th}$ iteration, if $V_{DC}^s$ is greater than or equal to the global optimal solution V subsequent to the $(s-1)^{th}$ iteration, a value of Vis unchanged, and directly using the global optimal solution V subsequent to the $(s-1)^{th}$ iteration as the global optimal solution V subsequent to the $s^{th}$ iteration;

C-5, determining whether Diff'[i] is equal to 0 or whether s is equal to 1000, if one of Diff'[i] is equal to 0 or s is equal to 1000 is met, using the global optimal solution V subsequent to the $s^{th}$ iteration as the optimal working voltage $V_{DC}0$-$V_{DC}15$ outputted from the 16 bits of parallel output terminals of the adaptive module, and ending an iteration process, if neither of Diff'[i] is equal to 0 or s is equal to 1000 is met, performing C-6;

C-6, updating voltage data $V_{DC}^{s+1}[1]$~$V_{DC}^{s+1}[100]$ generated for an $(s+1)^{th}$ generation with adopting to formula $V_{DC}^{s+1}[m]=V_{DC}^s[m]+\varphi \oplus Levy(\lambda)$ wherein $\lambda$ is a random number which is generated through an RC4 algorithm and is greater than or equal to 0 and less than or equal to 3, $\lambda$ is needed to regenerate whenever voltage data is generated, $\varphi$ is a step controlled amount, $\varphi=1$, $\oplus$ is dot-to-dot multiplication, Levy($\lambda$) is a random search path, and Levy($\lambda$)=$s^{-\lambda}$, determining whether $V_{DC}^{s+1}[m]$ is equal to $V_{TN}$ or $V_{TP}$, if so, considering $V_{DC}^{s+1}[m]$ as a bad value, discarding the bad value, and randomly regenerating a new $V_{DC}^{s+1}[m]$ by formula $V_{DC}^{s+1}[m]=V_{DC}^s[m]+\varphi \oplus Levy(\lambda)$ until 100 voltage data $V_{DC}^{s+1}[1]$~$V_{DC}^{s+1}[100]$ which are not equal to $V_{TN}$ or $V_{TP}$ are obtained;

C-7, updating the value of s with adopting to a sum of the current value of s adding 1, repeating steps from C-2 for a next iteration until the iteration process is ended, so as to obtain the optimal working voltage $V_{DC}0$-$V_{DC}15$ which is outputted form the 16 bits of parallel output terminals of the adaptive module;

the digital-to-analog converter converts the optimal working voltage $V_{DC}0$-$V_{DC}15$ outputted by the adaptive module into an analog voltage to output to the feedback terminal of the control module, and the control module adjusts the magnitude of the aging voltage signal VDC outputted at the first voltage output terminal of the control module as the magnitude of the analog voltage outputted at the output terminal of the digital-to-analog converter.

2. The adaptive anti-aging sensor based on the cuckoo algorithm according to claim 1, wherein each of the shaping circuits comprises a first PMOS transistor, a second PMOS transistor, a first NMOS transistor, a second NMOS transistor and a first inverter; a source of the first PMOS transistor and a source of the second PMOS transistor are both accessed to a power source, a gate of the first PMOS transistor, a drain of the second PMOS transistor and a drain of the second NMOS transistor are connected at a connecting terminal which is the output terminal of the shaping circuit, a drain of the first PMOS transistor, a gate of the second PMOS transistor and a drain of the first NMOS transistor are connected, a gate of the first NMOS transistor and an input terminal of the first inverter are connected at a connecting terminal which is the input terminal of the shaping circuit, an output terminal of the first inverter and a gate of the second NMOS transistor are connected, and a source of the first NMOS transistor and a source of the second NMOS transistor are both grounded.

3. The adaptive anti-aging sensor based on the cuckoo algorithm according to claim 1, wherein the frequency difference circuit is realized through a first D flip-flop, the first D flip-flop has an input terminal, a clock terminal and an output terminal, the input terminal of the first D flip-flop is the set terminal of the frequency difference circuit, the clock terminal of the first D flip-flop is the clock terminal of the frequency difference circuit, the output terminal of the first D flip-flop is the output terminal of the frequency difference circuit.

4. The adaptive anti-aging sensor based on a cuckoo algorithm according to claim 1, wherein the resolution adjustment circuit comprises a first 2-to-1 multiplexer, a second D flip-flop and a third D flip-flop, the first 2-to-1 multiplexer has a first input terminal, a second input terminal, a selection terminal and an output terminal, and the second D flip-flop and the third D flip-flop each have an input terminal, a clock terminal, an output terminal and an inverted output terminal, the input terminal of the second D flip-flop is connected to the inverted output terminal of the second D flip-flop, the clock terminal of the second D flip-flop is the input terminal of the resolution adjustment circuit, the output terminal of the second D flip-flop, the clock terminal of the third D flip-flop and the first input terminal of the first 2-to-1 multiplexer are connected, the input terminal of the third D flip-flop and the inverted output terminal of the third D flip-flop are connected, the output terminal of the third D flip-flop and the second input terminal of the first 2-to-1 multiplexer are connected, the selection terminal of the first 2-to-1 multiplexer is the control terminal of the resolution adjustment circuit, and the output terminal of the first 2-to-1 multiplexer is the output terminal of the resolution adjustment circuit.

5. The adaptive anti-aging sensor based on the cuckoo algorithm according to claim 1, wherein the 16-bit counter comprises 16 D flip-flops and 16 inverters, each of the D flip-flops has an input terminal, a clock terminal, a reset terminal and an output terminal respectively, the reset terminals of the 16 D flip-flops are connected at a connecting terminal which is the reset terminal of the 16-bit counter, the input terminal of the $k^{th}$ D flip-flop and the output terminal of the $k^{th}$ inverter are connected, k=1, 2, ..., 16, the output terminal of the $h^{th}$ D flip-flop, the input terminal of the $h^{th}$ inverter and the clock terminal of the $(h+1)^{th}$ D flip-flop are connected at a connecting terminal which is the $h^{th}$ output terminal of the 16-bit counter, h=1, 2, ..., 15, the output terminal of the $16^{th}$ D flip-flop and the input terminal of the $16^{th}$ inverter are connected at a connecting terminal which is the $16^{th}$ output terminal of the 16-bit counter, first output terminal to $16^{th}$ output terminal of the 16-bit counter are the 16 bits of parallel output terminals of the 16-bit counter.

\* \* \* \* \*